United States Patent
Wang et al.

(10) Patent No.: US 9,634,195 B2
(45) Date of Patent: *Apr. 25, 2017

(54) LIGHT-EMITTING DEVICE

(71) Applicant: EPISTAR CORPORATION, Hsinchu (TW)

(72) Inventors: Tsen-Kuei Wang, Hsinchu (TW);
Ming-Yung Jow, Hsinchu (TW);
Bor-Cherng Chen, Hsinchu (TW);
Tsung-Ta Yu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/015,509

(22) Filed: Feb. 4, 2016

(65) Prior Publication Data

US 2016/0155903 A1 Jun. 2, 2016

Related U.S. Application Data

(63) Continuation of application No. 14/180,960, filed on Feb. 14, 2014, now Pat. No. 9,287,459.

(51) Int. Cl.
| | |
|---|---|
| *H01L 33/00* | (2010.01) |
| *H01L 33/40* | (2010.01) |
| *H01L 33/06* | (2010.01) |
| *H01L 33/22* | (2010.01) |
| *H01L 33/32* | (2010.01) |
| *H01L 33/38* | (2010.01) |

(52) U.S. Cl.
CPC ............ *H01L 33/405* (2013.01); *H01L 33/06* (2013.01); *H01L 33/22* (2013.01); *H01L 33/32* (2013.01); *H01L 33/40* (2013.01); *H01L 33/38* (2013.01); *H01L 2933/0016* (2013.01)

(58) Field of Classification Search
CPC ....... H01L 33/40; H01L 33/405; H01L 33/22; H01L 33/32; H01L 33/06; H01L 33/38; H01L 2933/0016
See application file for complete search history.

(56) References Cited

U.S. PATENT DOCUMENTS

| | | |
|---|---|---|
| 5,563,422 A | 10/1996 | Nakamura et al. |
| 6,936,863 B2 | 8/2005 | Udagawa et al. |
| 8,643,046 B2 | 2/2014 | Okabe et al. |
| 2004/0169184 A1 | 9/2004 | Udagawa et al. |
| 2012/0049232 A1 | 3/2012 | Okabe et al. |

*Primary Examiner* — Nikolay Yushin
(74) *Attorney, Agent, or Firm* — Ditthavong & Steiner, P.C.

(57) ABSTRACT

A light-emitting device is provided. The light-emitting device comprises: a semiconductor system comprising a light-emitting semiconductor stack; and an electrode comprising a surface next to the semiconductor system and comprising a base material and a contact material different from the base material, wherein the contact material diffuses into the semiconductor system; wherein the contact material has a largest intensity at a first depth position from a SIMS spectrum, and a distance between the first depth position and the surface is not less than 500 nm.

19 Claims, 11 Drawing Sheets

… (1)

LIGHT-EMITTING DEVICE

REFERENCE TO RELATED APPLICATION

This application is a continuation application of a previously filed U.S. patent application Ser. No. 14/180,960 filed on Feb. 14, 2014, entitled as "LIGHT-EMITTING DEVICE". The disclosures of all references cited herein are incorporated by reference.

TECHNICAL FIELD

The disclosure relates to a light-emitting device, and more particularly to a light-emitting device comprising an electrode with improved adhesion.

DESCRIPTION OF BACKGROUND ART

Light-emitting diodes are power-saving and highly-efficient light sources. Based on different wavelengths of emitted light, light-emitting diodes can be applied to lighting, backlights in displays, and traffic indicators, etc. The demand for cost/performance (C/P) value and the brightness per unit area of light-emitting diodes is getting higher due to the wide applications of light-emitting diodes.

A conventional light-emitting diode comprises a substrate, a light-emitting semiconductor stack on the substrate, a first electrode on the light-emitting semiconductor stack and electrically connected to the light-emitting semiconductor stack, and a second electrode on a surface of the substrate opposite to the first electrode and electrically connected to the light-emitting semiconductor stack. The first electrode comprises a first layer proximal to the light-emitting semiconductor stack and a second layer on the first layer, wherein the second layer comprises an adhesion layer comprises Ti or Cr for increasing the adhesion between the first layer and the second layer. However, elements such as Ti or Cr are easy to be oxidized and thus form metal oxides due to the moisture in the environment, and such chemical reaction of the elements results in deterioration of the adhesion layer, and the deterioration further leads to a peeling problem between the first layer and the second layer.

The above light-emitting diode can be combined with a submount to form a lighting device. The lighting device comprises a submount with a circuit; a solder on the submount, by which the above light-emitting diode can be fixed on the submount, and the substrate of the above light-emitting diode is electrically connected to the circuit on the submount; and an electrical connection structure for electrically connecting the pads of the light-emitting diode and the circuit on the submount; wherein the above submount could be a lead frame or a large mounting substrate for facilitating the design of the electrical circuit of the lighting device and increasing the heat dissipation efficiency.

SUMMARY OF THE DISCLOSURE

A light-emitting device is provided. The light-emitting device comprises: a semiconductor system comprising a light-emitting semiconductor stack; and an electrode comprising a surface next to the semiconductor system and comprising a base material and a contact material different from the base material, wherein the contact material diffuses into the semiconductor system; wherein the contact material has a largest intensity at a first depth position from a SIMS spectrum, and a distance between the first depth position and the surface is not less than 500 nm.

DETAILED DESCRIPTION OF PREFERRED EMBODIMENTS

Figure 1:
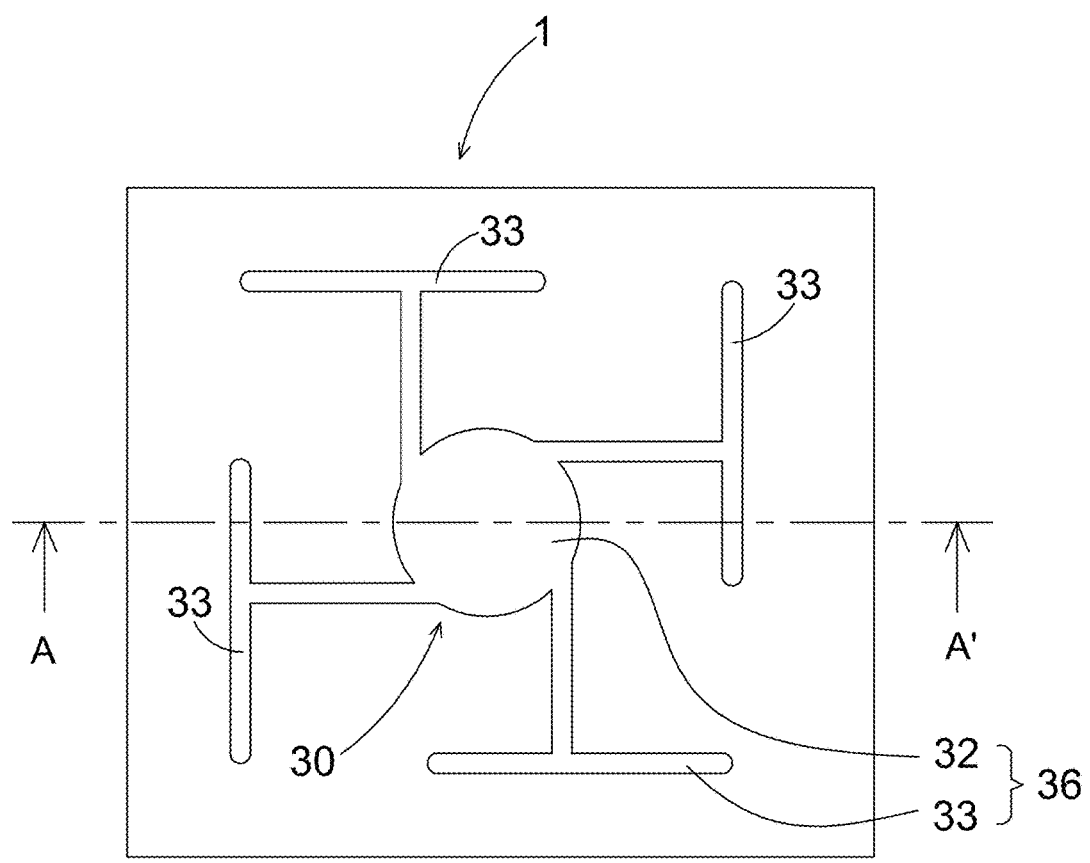
FIG. 1 is a top view of the light-emitting device in accordance with one of the embodiments of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

Figure 2:
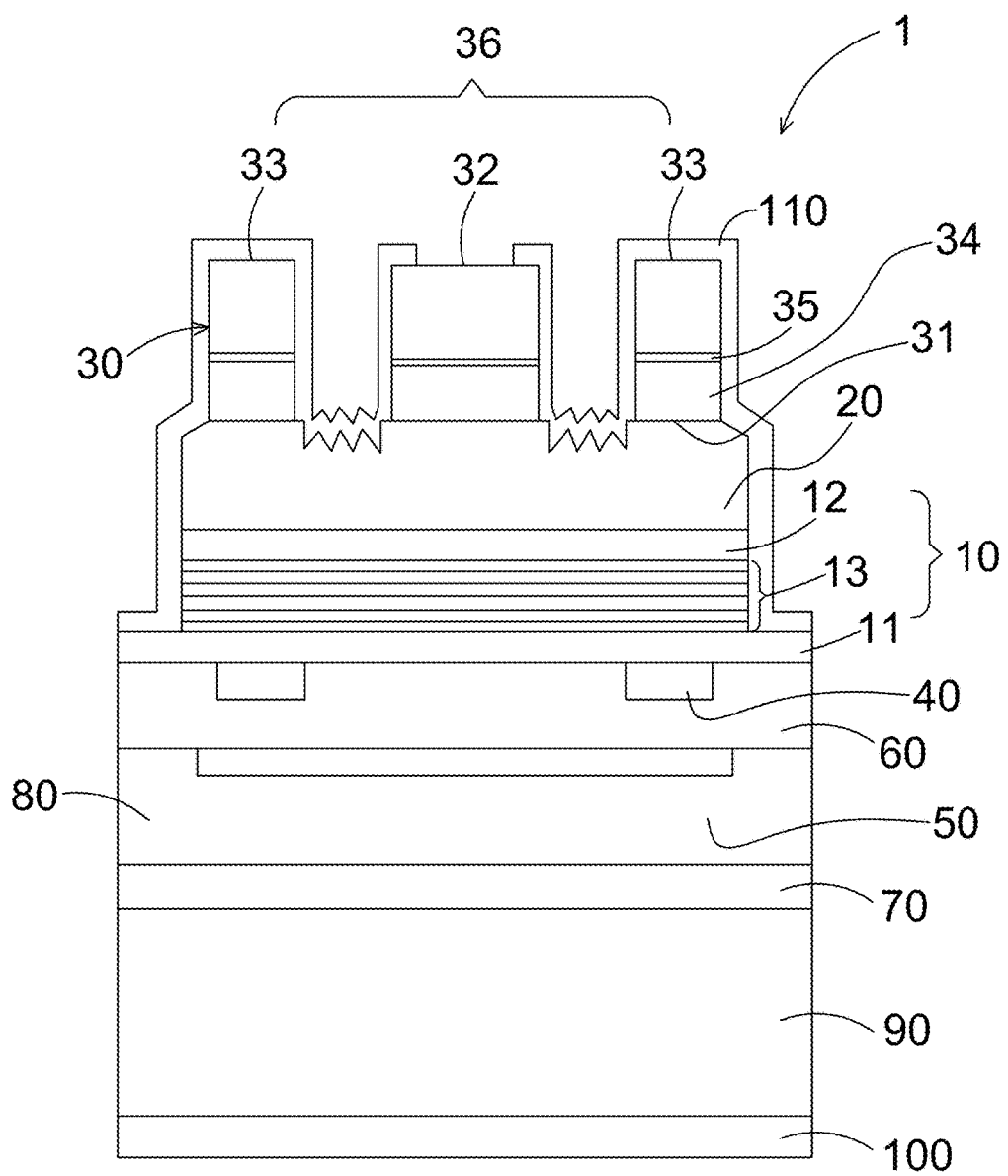
FIG. 2 is a cross-sectional diagram along the line of A-A' in accordance with the light-emitting device of the present application shown in FIG. 1.

FIG. 1 is a top view of the light-emitting device 1 in accordance with one of the embodiments of the present application. FIG. 2 is a cross-sectional diagram along the line of A-A' in accordance with the light-emitting element of the present application shown in FIG. 1. As shown in FIG. 2, the light-emitting device 1 comprises a light-emitting semiconductor stack 10, a window layer 20 on the light-emitting semiconductor stack 10, and an electrode 30 on the window layer 20, wherein the electrode 30 comprises a surface 31 proximal to the light-emitting semiconductor stack 10. The electrode 30 comprises a contact layer 34 on the window layer 20, a barrier layer 35 on the contact layer 34 and a current injection structure 36 on the barrier layer 35. Specifically, the surface 31 is the interface between the window layer 20 and the contact layer 34. As shown in FIG. 1 and FIG. 2, the current injection structure 36 comprises a pad 32 and multiple extensions 33 each extending outwardly from the pad 32. The contact layer 34 is right under the pad 32 and multiple extensions 33. The barrier layer 35 is interposed between the pad 32 and the contact layer 34, and is interposed between the multiple extensions 33 and the contact layer 34. The contact layer 34 is for achieving ohmic behavior between the window layer 20 and the current injection structure 36 so as to obtain desired electrical properties.

Referring to FIG. 3 to FIG. 8, the method for making the light-emitting device comprising steps of: providing a light-emitting semiconductor stack 10; forming a window layer 20 on the light-emitting semiconductor stack 10; forming a first layer 341 on the window layer 20, wherein the first layer 341 comprises a first metal sub-layer 3411, a second metal sub-layer 3412, and a first alloy sub-layer 3413 between the first metal sub-layer 3411 and the second metal sub-layer 3412; annealing the first layer 341; forming a second layer 342 on the first layer 341, wherein the second layer 342 comprises a third metal sub-layer 3421, a fourth metal sub-layer 3422 and a second alloy sub-layer 3423 between the third metal sub-layer 3421 and the fourth metal; forming a barrier layer 35 on the second layer 342; forming a current injection structure 36 on the barrier layer 35; annealing the above mentioned layers so as to turn the first layer 341 and the second layer 342 into the contact layer 34.

In one of the embodiments of the present application, the light-emitting semiconductor stack 10 comprises a first type semiconductor layer 11, a second type semiconductor layer 12 and a light-emitting layer 13 between the first type semiconductor layer 11 and the second type semiconductor layer 12. The first type semiconductor layer 11 is an n-type semiconductor for providing electrons, the second type semiconductor layer 12 can be a p-type semiconductor for providing holes, wherein the conductivity, electrical property, polarity, and/or dopant of the first type semiconductor layer 11 are different from that of the second type semiconductor layer 12. The first type semiconductor layer 11 and the second type semiconductor layer 12 comprise Group III-V semiconductor materials. The light-emitting layer 13 could be an intrinsic, an n-type, or a p-type semiconductor. The structure of the light-emitting layer 13 can be single heterostructure (SH), double heterostructure (DH), double-side double heterostructure (DDH) or multi-quantum well (MQW), wherein the wavelength of the light emitted from the light-emitting layer 13 can be changed by adjusting the number of MQW pairs. The material of the light-emitting layer 13 comprises aluminum gallium indium phosphide-based material (AlGaInP), aluminum gallium indium nitride-based material (AlGaInN), or zinc oxide-based material (ZnO).

In one of the embodiments of the present application, the window layer 20 is on the second type semiconductor layer 12 and comprises one element selected from the group consisting of Al, Ga, In, As, P, and N, such as GaN, AlGaInP or any other suitable materials. Preferably, the window layer 20 is of the same conductivity-type as the second type semiconductor layer 12, such as a p-type GaP layer. A part of an upper side of the window layer 20 that is uncovered by the electrode 30 is roughened. Furthermore, the upper side of the window layer 20 comprises a mesa structure formed on a part of the upper side that is under the electrode 30. The window layer 20 is substantially transparent to the light generated by the light-emitting layer 13.

Figure 3:
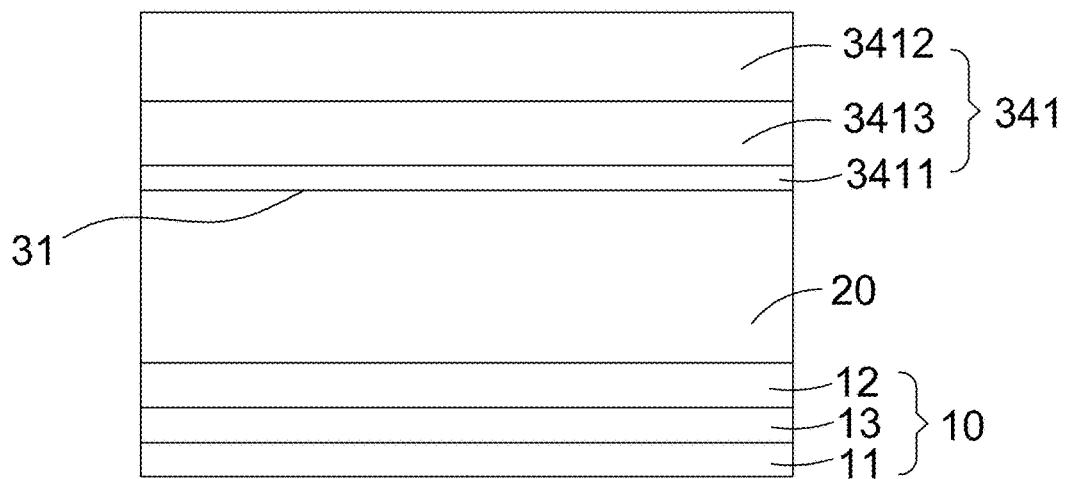
FIGS. 3 through 8 are cross-sectional views of a light-emitting device during a manufacturing process in accordance with one of the embodiments of the present application.
Figure 9:
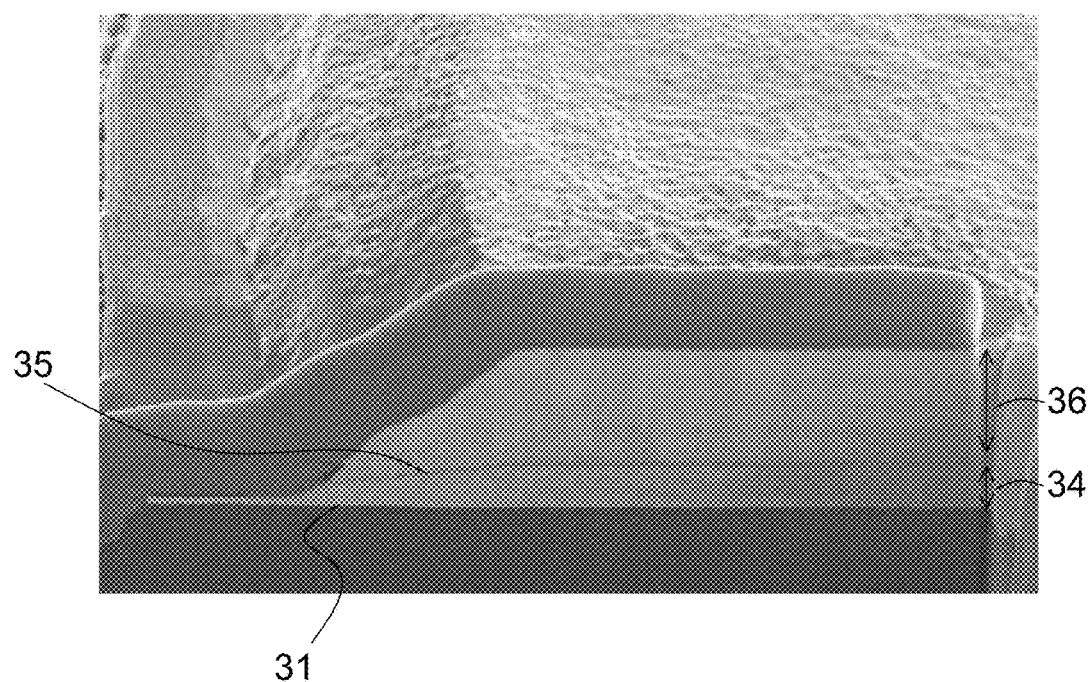
FIG. 9 is a scanning electron microscope (SEM) image showing an enlarged detail of region I in FIG. 8.
Figure 10:
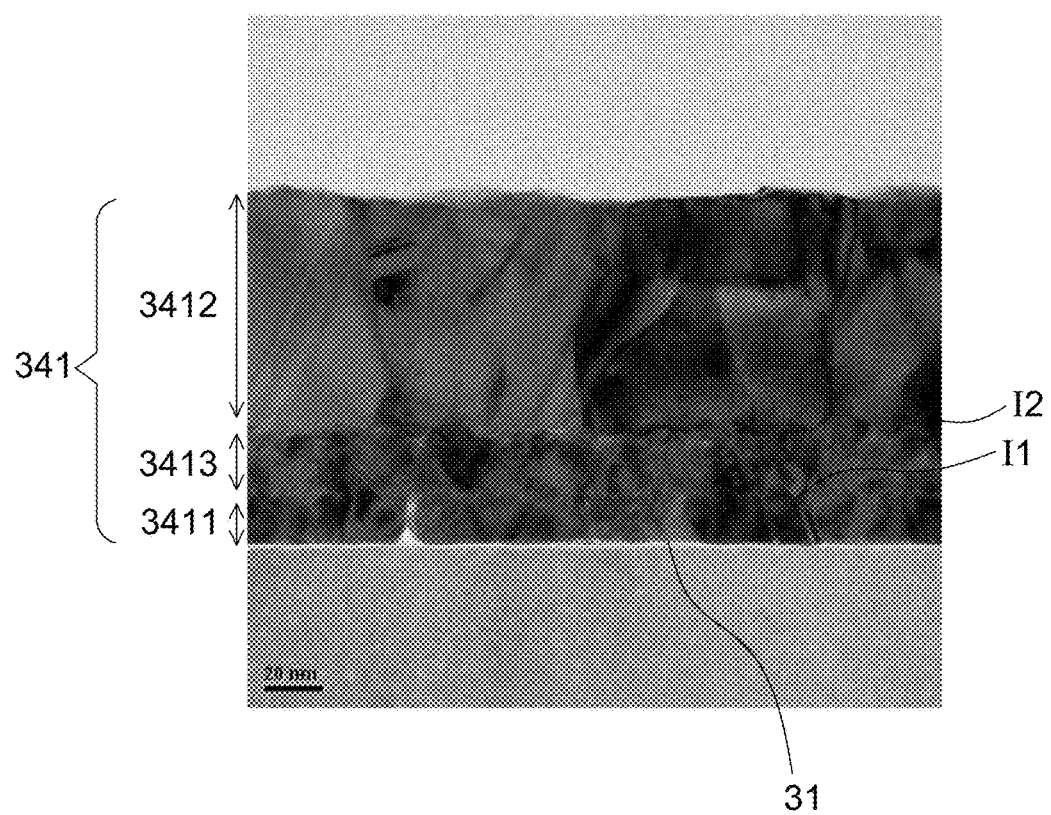
FIG. 10 is a transmission electron microscopy (TEM) image showing the first metal sub-layer, the second metal sub-layer and the first alloy sub-layer of the first layer of a light-emitting device in accordance with one of the embodiments of the present application.

Referring to FIG. 3, in one of the embodiments of the present application, the first metal sub-layer 3411, the second metal sub-layer 3412 and the first alloy sub-layer 3413 of the first layer 341 comprise a base material for facilitating current injection, wherein the base material comprise metal. Preferably, the base material comprises Au. Furthermore, the first alloy sub-layer 3413 comprises a contact material different from the base material, capable of forming an ohmic contact with semiconductor material and forming an alloy with the base material. Preferably, the contact material is capable of forming an ohmic contact with a Group III-V semiconductor material. Referring to FIG. 10, which is a transmission electron microscopy (TEM) image showing the first metal sub-layer 3411, the second metal sub-layer 3412 and the first alloy sub-layer 3413 of the first layer 341. As shown in FIG. 9, a visible interface I1 is between the first metal sub-layer 3411 and the first alloy sub-layer 3413, and another visible interface I2 is between the first alloy sub-layer 3413 and the second metal sub-layer 3412. Specifically, the surface 31 is the interface between the window layer 20 and the first layer 341. Preferably, the reactivity of the contact material is higher than the reactivity of Pt. More preferably, the contact material comprises Be, Se, Sn, Zn, and combinations thereof. In the present embodiment, the first alloy sub-layer 3413 comprises Be for forming an ohmic contact with the window layer 20. Specifically, the first alloy sub-layer 3413 comprises AuBe, wherein Au content is of, but not limited to 98% by mass, and Be content is, but not limited to of 2% by mass. A thickness of the first layer 341 is not more than 300 nm with a preferable range from 100 nm to 300 nm. A thickness of the first alloy sub-layer 3413 ranges from 50 to 100 nm. Specifically, the thickness of the second metal sub-layer 3412 is larger than the thickness of the first alloy sub-layer.

Figure 4:
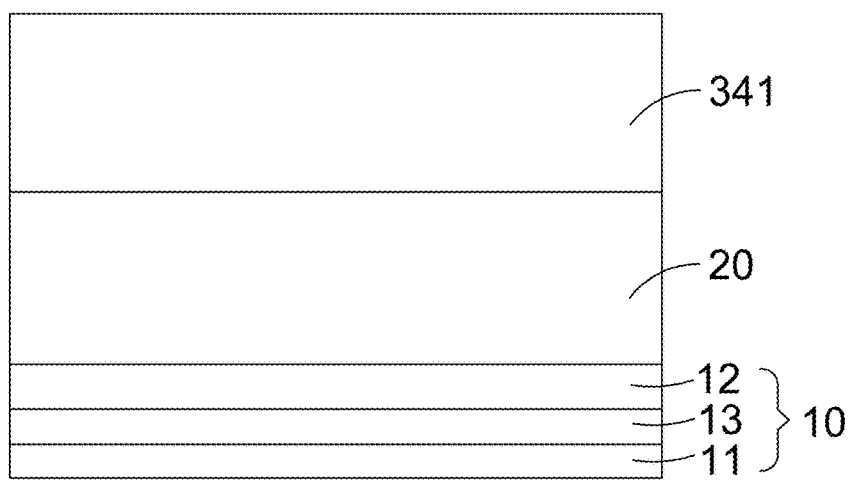
Figure 11:
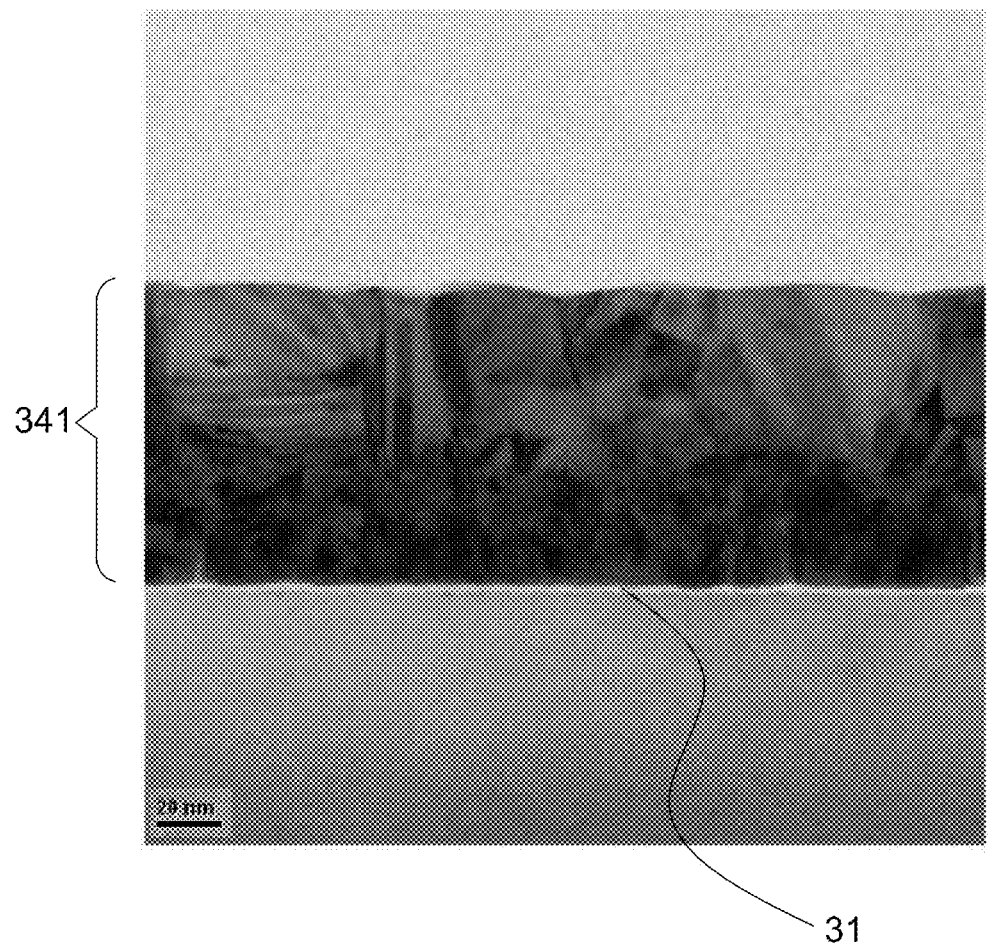
FIG. 11 is a transmission electron microscopy (TEM) image showing the first layer of a light-emitting device in accordance with one of the embodiments of the present application.
Figure 12:
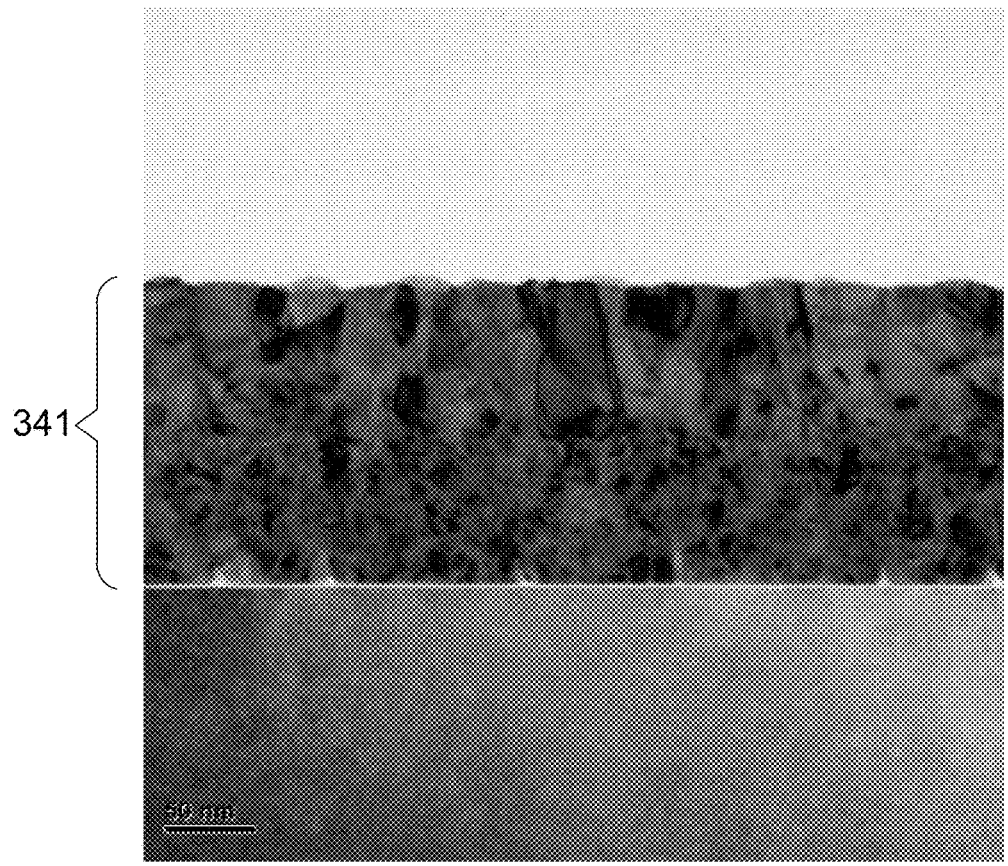
FIG. 12 is a transmission electron microscopy (TEM) image showing the first layer of a light-emitting device in accordance with one of the embodiments of the present application.

Referring to FIG. 4, FIG. 11 and FIG. 12, in one of the embodiments of the present application, the step of annealing the first layer 341 is carried out under a temperature higher than 450° C. As shown in FIG. 11 and FIG. 12, after the step of annealing the first layer 341, the interface I1 (not shown in FIG. 11 and FIG. 12) between the first metal sub-layer 3411 and the first alloy sub-layer 3413, and the interface I2 (not shown in FIG. 11 and FIG. 12) between first alloy sub-layer 3413 and the second metal sub-layer 3412 as shown in FIG. 10 are obviously more unclear than that before the step of annealing. Accordingly, the first layer 341 after annealing is substantially a single layer. Furthermore, the contact material of the first alloy sub-layer 3413 diffuses into the first metal sub-layer 3411, the second metal sub-layer 3412 and the window layer 20 during the step of annealing and thus is distributed over the first layer 341 and a part of the window layer 20 after the step of annealing.

Figure 5:
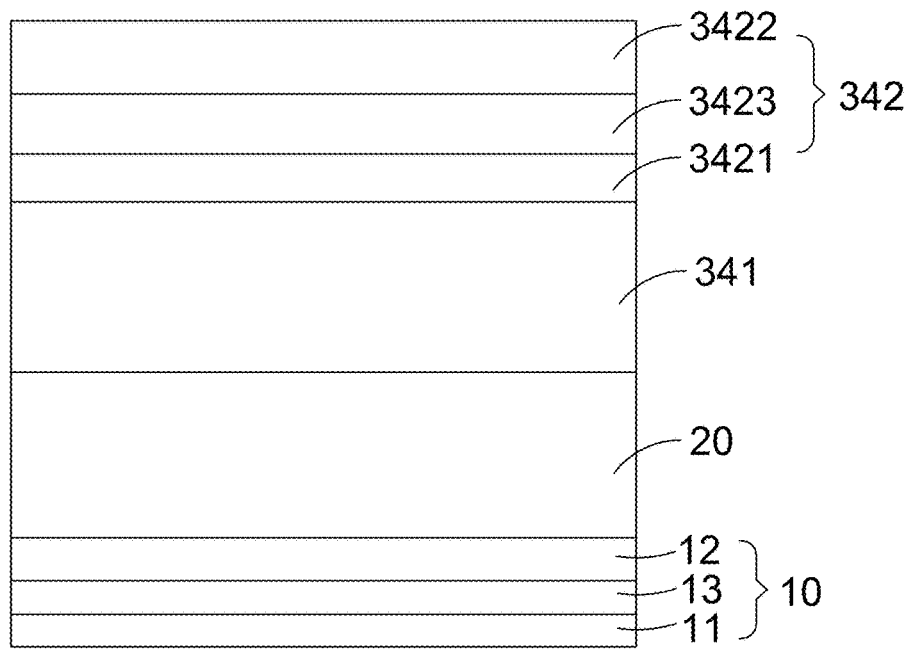

Referring to FIG. 5, in one of the embodiments of the present application, the third metal sub-layer 3421, the fourth metal sub-layer 3422 and the second alloy sub-layer 3423 of the second layer 342 comprise a base material for facilitating current injection, wherein the base material comprise metal. Furthermore, the second alloy sub-layer 3423 comprises a contact material different from the base material, capable of forming an ohmic contact with a semiconductor material, and capable of forming alloy with the base material. The contact material comprises Be, Se, Sn, Zn, and combinations thereof. The contact material of the second alloy sub-layer 3423 can be the same or different from the contact material of the first alloy sub-layer 3413. Preferably, the contact material of the second alloy sub-layer 3423 is the same as the contact material of the first alloy sub-layer 3413. In the present embodiment, the first alloy sub-layer 3413 comprises AuBe, wherein Au content is of, but not limited to 98% by mass, and Be content is, but not limited to of 2% by mass. A thickness of the second layer 342 is larger than a thickness of the first layer 341. Specifically, the thickness of the second alloy sub-layer 3423 is larger than the thickness of the first alloy sub-layer 3413. Preferably, the thickness of the second layer 342 ranges from 500 nm to 1500 nm. The thickness of the second alloy sub-layer can be adjusted to obtain a desired adhesion between the first layer 341 and the second layer 342 during the step of annealing the layers so as to form a contact layer 34. A total amount of the contact material of the second alloy sub-layer 3423 is larger than a total amount of the contact material of the first alloy sub-layer 3413. In the present embodiment, since the thickness of the second alloy sub-layer 3423 is larger than the thickness of the first alloy sub-layer 3413, the total amount of Be of the second alloy sub-layer 3423 is thus larger than the total amount of Be of the first alloy sub-layer 3413.

Figure 6:
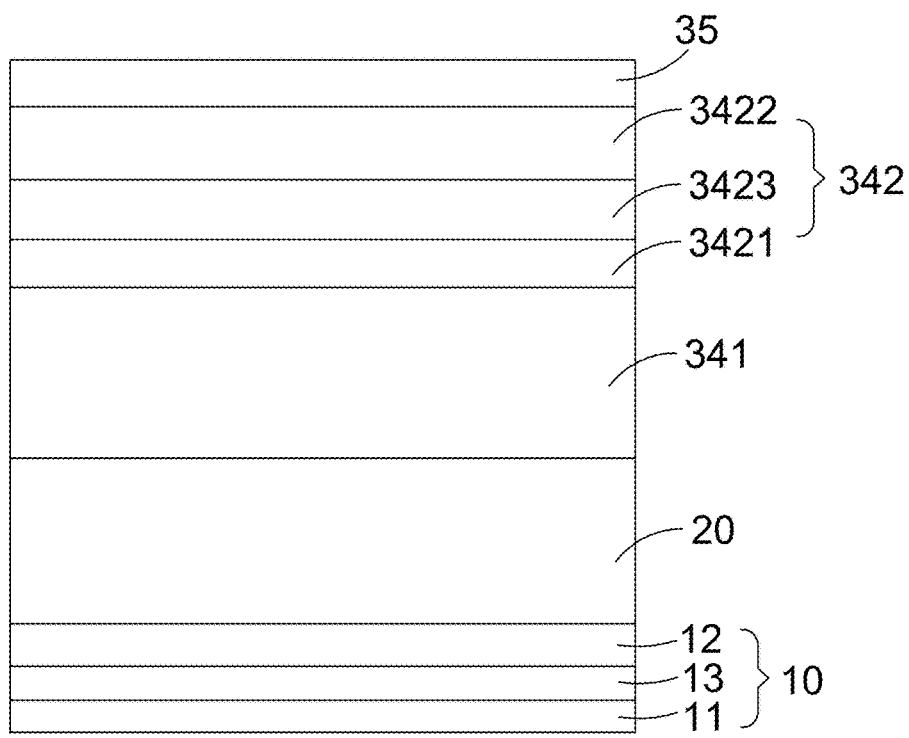

Referring to FIG. 6, in one of the embodiments of the present application, the barrier layer 35 is for separating the second layer 342 from the current injection structure 36 and reducing diffusion amount of the contact material toward the current injection structure 36, and thus makes the contact material diffuse toward the window layer 20. The barrier layer 35 comprises Zn, W, Ni or Pt. A thickness of the barrier layer 35 ranges from 30 nm to 100 nm.

Figure 7:
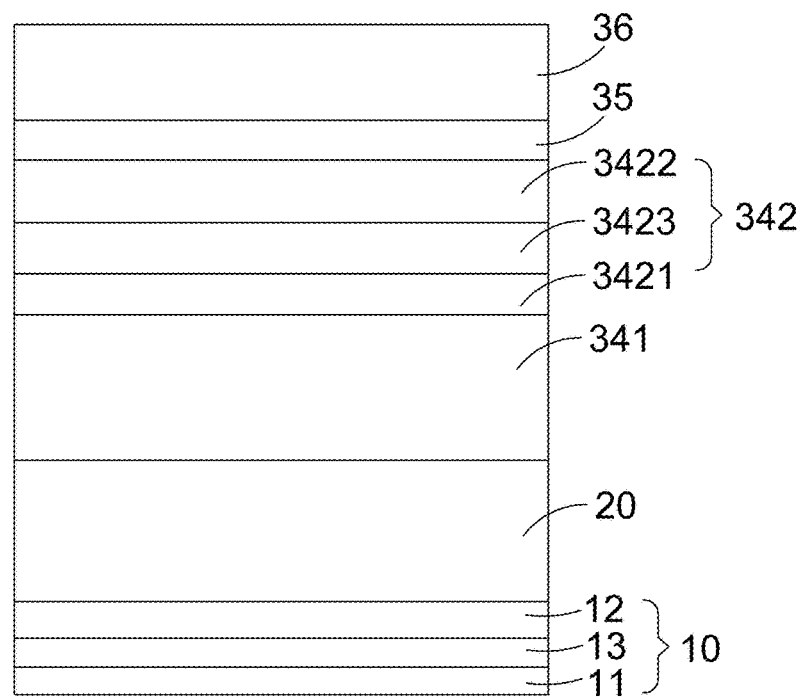

Referring to FIG. 7, in one of the embodiments of the present application, the current injection structure 36 comprises a base material for facilitating current injection, wherein the base material comprise metal. In the present embodiment, the current injection structure 36 comprises Au. Specifically, a part of the current injection structure 36, such as the pad 32, is for wire bonding, and the other part of the current injection structure 36, such as the extensions 33, is for improving current spreading. In another embodiment, the current injection structure 36 comprises a pad 32. The contact layer 34 comprises a first portion (not shown) and a second portion (not shown), wherein the first portion is right under the pad 32 and wherein the second portion extends outwardly from the first portion. The barrier layer 35 is interposed between the pad 32 and the first portion. A thickness of the current injection structure 36 is larger than 500 nm.

Figure 8:
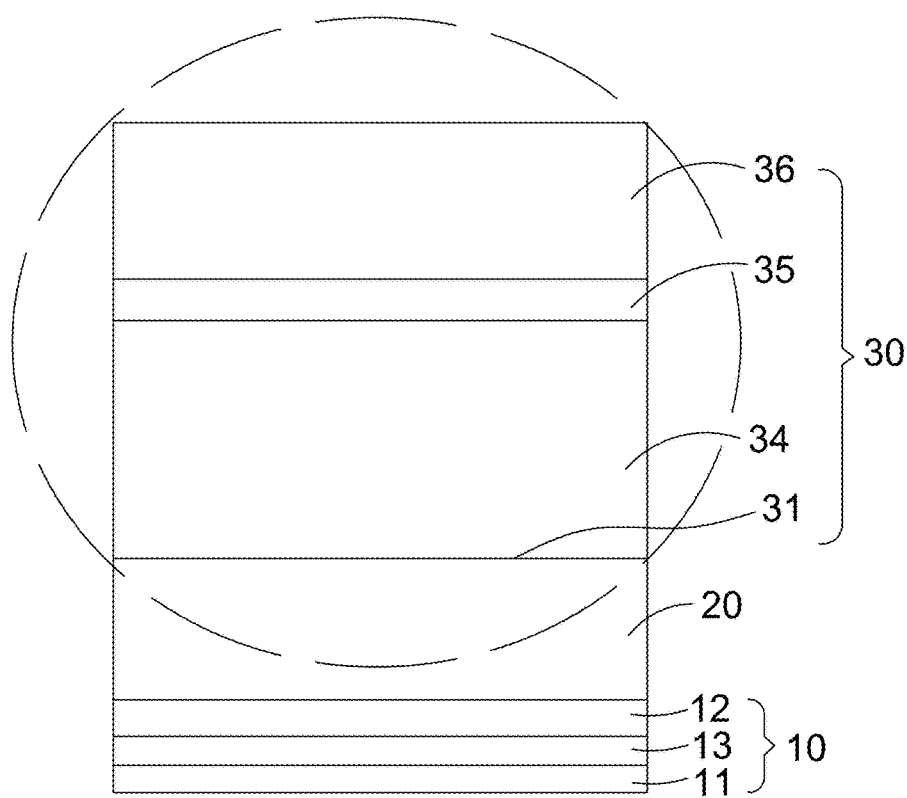

Referring to FIG. 8, in one of the embodiments of the present application, the step of annealing the layers so as to turn the first layer 341 and the second layer 342 into the contact layer 34 is carried out under a temperature ranging from 200° C. to 400° C. More preferable, the step of annealing is carried out under a temperature lower than the temperature for annealing the first layer 341. After the above mentioned step of annealing, the interface between the first layer 341 and the second layer 342 are obviously more unclear than that before the step of annealing. Furthermore, the contact material of the second layer 342 diffuses into the window layer 20 during the step of annealing and thus is distributed over the contact layer 34 and a part of the window layer 20. FIG. 9 is a scanning electron microscope (SEM) image showing an enlarged detail of region I in FIG. 8. As shown in FIG. 9, the interface between the barrier layer 35 and the contact layer 34 and the interface between the barrier layer 35 and the current injection structure 36 are visible.

Figure 13:
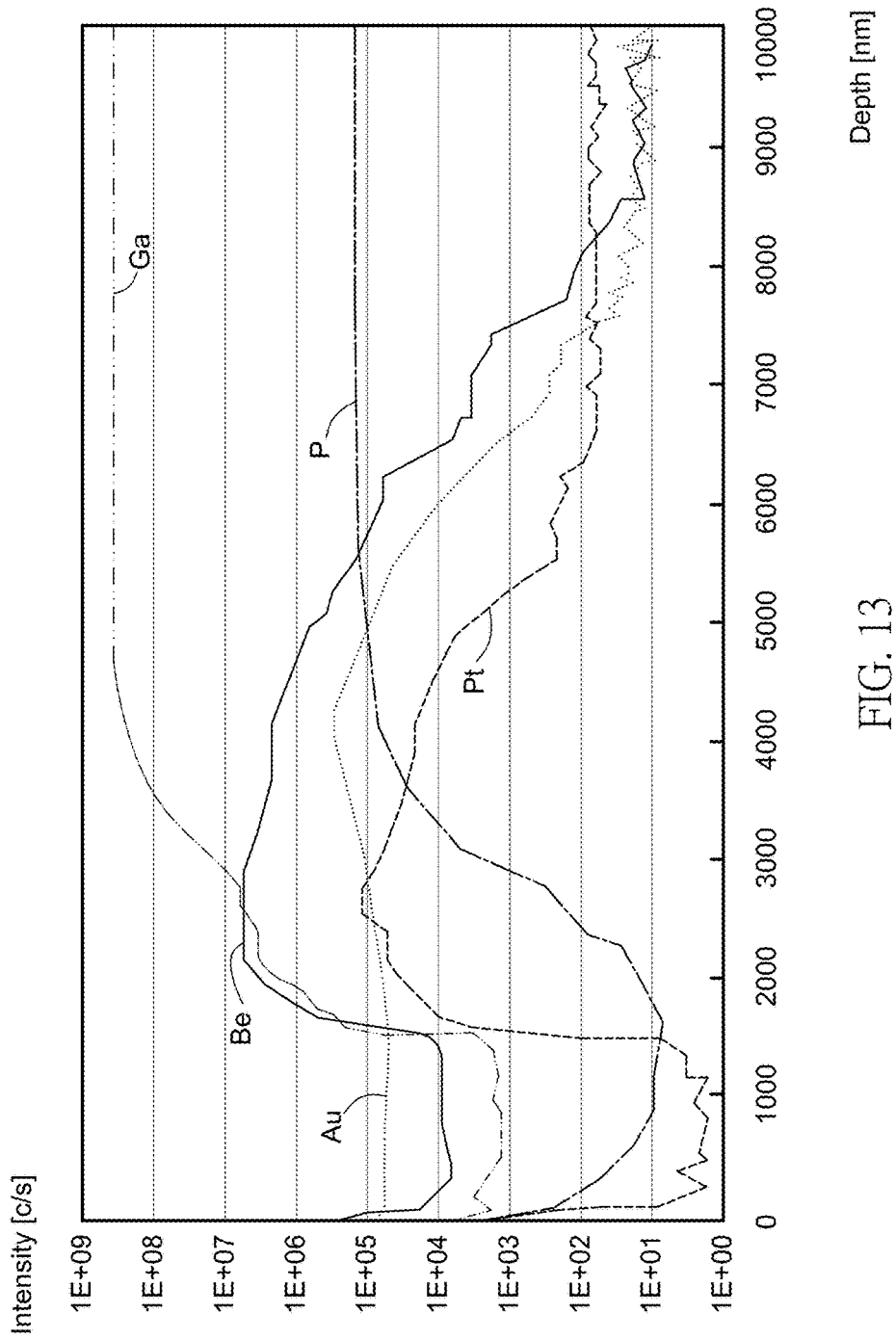
FIG. 13 is a graph showing a relation between the intensities of elements and the depth of the electrode and a part of the window layer.
Figure 14:
FIG. 14 is a graph showing an enlarged detail of region from 1000 nm to 6000 nm in FIG. 13.

In one of the embodiments of the present application, the thickness of the first layer 341 is about 130 nm. The thickness of the second layer 342 is about 1000 nm. The thickness of the barrier layer 35 is about 50 nm. The thickness of the current injection structure 36 is about 2600 nm. FIG. 13 is a graph showing a relation between the intensities of elements and the depth of the electrode 30 and a part of the window layer 20, wherein the relation is determined by secondary ion mass spectrometry (SIMS). FIG. 14 is a graph showing an enlarged region from 1000 nm to 6000 nm in FIG. 13. In the present embodiment, a depth larger than 3800 nm shows the region of the window layer 20 while a depth smaller than 3800 nm shows the region of the electrode 30. A depth between about 2650 nm and about 3800 nm shows the region of the contact layer 34. Specifically, a depth between about 2650 nm and about 2600 nm shows the region of the barrier layer 35 and a depth smaller than 2600 nm shows the region of the current injection structure 36. Specifically, the surface 31 of the electrode 30 is at a depth of about 3800 nm. A distance between a position of the electrode 30 with a largest concentration of the contact material and the surface 31 of the electrode 30 is about 1000 nm, wherein the position of the electrode 30 with the largest concentration of the contact material is at a depth of about 2800 nm and lies in the contact layer 34. Specifically, the contact material in the present embodiment Be diffuses into the window layer 20, into the barrier layer 35, and into the current injection structure 36.

In the present application, the position with a largest concentration of the contact material lies in the electrode 30. Specifically, the distance can be adjusted by the thickness of the first layer 341 and the thickness of the second layer 342. The distance between the position of the largest concentration of the contact material and the surface 31 is preferably not less than 500 nm.

Because the position with a largest concentration of the contact material lies in the electrode 30, the light-emitting device 1 of the present application comprises an electrode 30 comprising the contact layer 34 with improved adhesion to adjacent layers; meanwhile, the electrode 30 of the light-emitting device 1 still forms a good ohmic contact with a semiconductor system, such as the window layer 20.

In one of the embodiments of the present application, the electrode 30 is substantially devoid of Ti or/and Cr, which means the electrode 30 is substantially devoid of a trace amount of Ti or/and Cr. However, other structures of the light-emitting device 1 may comprises Ti or/and Cr for obtaining desired characteristics of the light-emitting device.

The light-emitting device 1 of the present application undergoes an LED burn-in test in lamp form, wherein the conditions of the LED burn-in test are as follows. The temperature is 85° C., relative humidity (RH) is 85%, and current is 2 mA. After 3000 hours, the adhesion between the contact layer 34 and the barrier layer 35 and the adhesion between the barrier layer 35 and the current injection structure 36 remain unaffected, while a conventional light-emitting device undergoing the same burn-in test has peeling between the layers of the electrode and has broken extensions. Accordingly, the light-emitting device in accordance with the present embodiment comprises an electrode with improved adhesion. Furthermore, compared to a conventional light-emitting device, the forward voltage of the light-emitting device after the burn-in test increases only 8% while the forward voltage of the conventional light-emitting device increases 45%.

Referring to FIG. 2, in one of the embodiments of the present application, the light-emitting device 1 further comprises an ohmic contact layer 40 on a surface of the first type semiconductor layer 11 opposite to the electrode 30. The ohmic contact layer 40 comprises conductive material for forming ohmic contact with the first type semiconductor layer 11. The light-emitting device 1 may also comprise a reflecting layer 50 on the ohmic contact layer 40, wherein the reflecting layer 50 reflects the light generated by the light-emitting layer 13 and preferably comprises a conductive material comprising metal, such as Ag, Ti, Ni, Pt, Al. The light-emitting device 1 further comprises a transparent conductive layer 60 between the first type semiconductor layer 11 and the reflecting layer 50, and the transparent conductive layer 60 preferably covers the ohmic contact layer 40. The refractive index of the transparent conductive layer 60 is lower than the refractive index of the first type semiconductor layer 11, and the material of the transparent conductive layer 60 preferably comprises metal oxide, such as indium tin oxide (ITO), cadmium tin oxide (CTO), antimony tin oxide, indium zinc oxide, zinc aluminum oxide, and zinc tin oxide. The transparent conductive layer 60 and the reflecting layer 50 improve the light extraction efficiency of the light-emitting device 1. The transparent conductive layer 60 and the ohmic contact layer 40 improve current spreading along a lateral and a vertical direction respectively. Furthermore, the light-emitting device 1 comprises a metal sub-layer 70 for bonding the reflecting layer 50 to a carrier 90. The metal sub-layer 70 comprises In, Au, Sn, Pb, InAu, SnAu, and the alloy thereof. The carrier 90 comprises Si. An obstruction layer 80 can be formed between the transparent conductive layer 60 and the metal sub-layer 70, and the obstruction layer 80 preferably covers the reflecting layer 50. The obstruction layer 80 reduces deterioration of the material of the reflecting layer 50 and reduces diffusion of the material toward the metal sub-layer 70. The obstruction layer 80 comprises Ti, Pt, and Au. Lastly, the light-emitting device 1 comprises a backside electrode 100 on the carrier 90 away from the light-emitting semiconductor stack 10. The backside electrode 100 comprises Cu, Sn, Au, Ni, Pt, Al, Ti, Cr, Pb, Cu—Sn, Cu—Zn, Cu—Cd, Sn—Pb—Sb, Sn—Pb—Zn, Ni—Sn, Ni—Co, Au alloy, Au—Cu—Ni—Au or combinations thereof.

Referring to FIG. 1 and FIG. 2, in one of the embodiments of the present application, the light-emitting device 1 further comprises a protection layer 110 covering light-emitting semiconductor stack 10, the window layer 20 and the extensions 33 and a part of the pad 32 so as to expose a part of the current injection structure 36 for wire bonding. The protection layer 110 protects the light-emitting device 1 from environment damage, such as moisture, or mechanical damage.

In one of the embodiments of the present application, the light-emitting device 1 is a vertical-type light-emitting device 1, and the electrode 30 is a p-type electrode away from the carrier 90.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
a semiconductor system comprising a light-emitting semiconductor stack; and
an electrode comprising a surface next to the semiconductor system and comprising a base material and a contact material different from the base material, wherein the contact material diffuses into the semiconductor system;
wherein the contact material has a largest intensity at a first depth position from a SIMS spectrum, and a distance between the first depth position and the surface is not less than 500 nm.

2. The light-emitting device according to claim 1, wherein the semiconductor system comprises a window layer on the light-emitting semiconductor stack, and the window layer comprises a contact material the same as the contact material in the electrode and comprises a base material the same as the base material in the electrode.

3. The light-emitting device according to claim 2, wherein at a second depth position in a region of the window layer from the SIMS spectrum, the contact material in the window layer has a first intensity and the base material in the window layer has a second intensity.

4. The light-emitting device according to claim 3, wherein the first intensity is larger than the second intensity.

5. The light-emitting device according to claim 2, wherein the window layer comprises one element selected from the group consisting of Al, Ga, In, As, P, and N.

6. The light-emitting device according to claim 2, wherein a part of an upper side of the window layer that is uncovered by the electrode is roughened.

7. The light-emitting device according to claim 1, wherein the electrode further comprises a contact layer comprising a first layer and a second layer, and the first layer is between the second layer and the semiconductor system.

8. The light-emitting device according to claim 7, wherein the first layer has a thickness not more than 300 nm.

9. The light-emitting device according to claim 7, wherein the first layer has a thickness between 100 nm and 300 nm both included.

10. The light-emitting device according to claim 7, wherein the second layer has a thickness larger than a thickness of the first layer.

11. The light-emitting device according to claim 7, wherein the second layer has a thickness between 500 nm and 1500 nm both included.

12. The light-emitting device according to claim 7, wherein the electrode further comprises a barrier layer on the contact layer.

13. The light-emitting device according to claim 12, wherein the barrier layer has a thickness between 30 nm and 100 nm both included.

14. The light-emitting device according to claim 12, wherein the barrier layer comprises Zn, W, Ni or Pt.

15. The light-emitting device according to claim 1, wherein the base material has an intensity less than the largest intensity of the contact material at the first depth position from the SIMS spectrum.

16. The light-emitting device according to claim 1, wherein the semiconductor system comprises the contact material.

17. The light-emitting device according to claim 1, wherein the contact material has a reactivity higher than that of Pt.

18. The light-emitting device according to claim 1, wherein the contact material is selected from the group consisting of Be, Se, Sn, Zn, and combinations thereof.

19. The light-emitting device according to claim 1, wherein the electrode is devoid of Ti or/and Cr.

* * * * *